United States Patent
Derkacs et al.

(10) Patent No.: US 11,282,979 B2
(45) Date of Patent: Mar. 22, 2022

(54) DISTRIBUTED BRAGG REFLECTOR STRUCTURES IN MULTIJUNCTION SOLAR CELLS

(71) Applicant: SolAero Technologies Corp., Albuquerque, NM (US)

(72) Inventors: Daniel Derkacs, Albuquerque, NM (US); Bed Pantha, Albuquerque, NM (US); Samantha Cruz, Albuquerque, NM (US); Nathaniel Miller, Albuquerque, NM (US); Pravin Patel, Albuquerque, NM (US); Alexander Haas, Albuquerque, NM (US)

(73) Assignee: SolAero Technologies Corp., Albuquerque, NM (US)

( * ) Notice: Subject to any disclaimer, the term of this patent is extended or adjusted under 35 U.S.C. 154(b) by 0 days.

(21) Appl. No.: 16/897,638

(22) Filed: Jun. 10, 2020

(65) Prior Publication Data
US 2021/0391493 A1  Dec. 16, 2021

Related U.S. Application Data

(62) Division of application No. 15/449,590, filed on Mar. 3, 2017, now Pat. No. 10,749,053.

(51) Int. Cl.
*H01L 31/18* (2006.01)
*H01L 31/052* (2014.01)
*H01L 31/0687* (2012.01)

(52) U.S. Cl.
CPC ........ *H01L 31/1844* (2013.01); *H01L 31/052* (2013.01); *H01L 31/06875* (2013.01)

(58) Field of Classification Search
CPC ........... H01L 31/02327; H01L 31/0547; H01L 31/0336; H01L 31/0687; H01L 31/0725;
(Continued)

(56) References Cited

U.S. PATENT DOCUMENTS 9,018,521 B1 * 4/2015 Cornfeld ............. H01L 31/1892
  136/262
10,541,349 B1 * 1/2020 Stan ....................... H01L 31/184
(Continued)

FOREIGN PATENT DOCUMENTS

| EP | 1469528 A2 | 10/2004 | |
|----|------------|---------|---|
| EP | P180086 | 7/2018 | |
| EP | 3370265 A1 * | 9/2018 | ......... H01L 31/0336 |

OTHER PUBLICATIONS

Bett, A.W. et al., "Advanced III-V Solar Cell Structures Grown by MOVPE", Solar Energy Materials & Solar Cells, Feb. 2001, pp. 541-550, (66), Elsevier Science Publishers, Amsterdam.
(Continued)

*Primary Examiner* — Earl N Taylor

(57) ABSTRACT

A multijunction solar cell and its method of fabrication, including an upper and a lower solar subcell each having an emitter layer and a base layer forming a photoelectric junction; a near infrared (NIR) wideband reflector layer disposed below the upper subcell and above the lower subcell for reflecting light in the spectral range of 900 to 1050 nm which represents unused and undesired solar energy and thereby reducing the overall solar energy absorptance in the solar cell and providing thermodynamic radiative cooling of the solar cell when deployed in space outside the atmosphere.

19 Claims, 7 Drawing Sheets

(58) Field of Classification Search
CPC ............. H01L 31/0232; H01L 31/0236; H01L 31/054; H01L 31/1844; H01L 31/052; H01L 31/06875
See application file for complete search history.

(56) References Cited

U.S. PATENT DOCUMENTS

| | | | | |
|---|---|---|---|---|
| 10,636,926 | B1* | 4/2020 | McGlynn | H01L 31/0687 |
| 10,700,230 | B1* | 6/2020 | Derkacs | H01L 31/06875 |
| 10,749,053 | B2* | 8/2020 | Derkacs | H01L 31/0336 |
| 10,770,612 | B1* | 9/2020 | Derkacs | H01L 31/047 |
| 2001/0018924 | A1 | 9/2001 | Hisamatsu et al. | |
| 2003/0145884 | A1* | 8/2003 | King | H01L 31/0725 136/255 |
| 2005/0081910 | A1* | 4/2005 | Danielson | H01L 31/0687 136/255 |
| 2006/0175961 | A1* | 8/2006 | Choong | H01L 51/5265 313/506 |
| 2010/0147366 | A1* | 6/2010 | Stan | H01L 31/0725 136/255 |
| 2014/0076401 | A1* | 3/2014 | King | H01L 31/0725 136/261 |
| 2015/0357501 | A1* | 12/2015 | Derkacs | H01L 31/03046 136/255 |
| 2016/0365466 | A1* | 12/2016 | Derkacs | H01L 31/043 |
| 2017/0054048 | A1* | 2/2017 | Derkacs | H01L 31/1844 |
| 2017/0062642 | A1* | 3/2017 | Pantha | H01L 31/1844 |
| 2017/0092800 | A1* | 3/2017 | Derkacs | H01L 31/03046 |
| 2017/0110614 | A1* | 4/2017 | Derkacs | H01L 31/02008 |
| 2017/0222066 | A1* | 8/2017 | Derkacs | H01L 31/078 |
| 2018/0062017 | A1* | 3/2018 | Derkacs | H01L 31/06875 |
| 2018/0062018 | A1* | 3/2018 | Meusel | H01L 31/03046 |
| 2018/0226528 | A1* | 8/2018 | Hart | H01L 31/078 |
| 2018/0226532 | A1* | 8/2018 | Hart | H01L 31/078 |
| 2018/0240922 | A1* | 8/2018 | Derkacs | H01L 31/078 |
| 2018/0254357 | A1* | 9/2018 | Derkacs | H01L 31/0547 |
| 2020/0027999 | A1* | 1/2020 | Derkacs | H01L 31/078 |
| 2020/0119213 | A1* | 4/2020 | Derkacs | H01L 31/0687 |

OTHER PUBLICATIONS

Bushnell D.B. et al., "Short-circuit Current Enhancement in Bragg Stack Multi-Quantum-Well Solar Cells for Multijunction Space Cell Applications," Solar Energy Materials and Solar Cells, Jan. 2003, pp. 299-305, (75), Elsevier Science Publishers, Amsterdam.

Dimroth, F. et al.," Next Generation GaInP/GaInAs/Ge Multi-junction Space Solar Cells," 17th European Photovoltaic Solar Energy Conference, Oct. 22-26, 2001, pp. 2150-2154, (17), Proceedings of the International Photovoltaic Solar Energy Conference, Munich, Germany.

Dimrtoh, F. et al., "3-6 Junction Photovoltaic Cells for Space and Terrestrial Concentrator Applications," IEEE Photovoltaic Speacialists Conference, Jan. 3, 2005, pp. 525-529, (23) IEEE, Lake Buena Vista, Florida.

Friedman, D.J. et al., "1-eV Solar Cells with GaInNAs Active Layer," Journal of Crystal Growth, Dec. 1998, pp. 409-415, (195), Elsevier Science Publishers, Amsterdam.

Hatcher, M., "Solar Cell Manufactures Come Back Down to Earth," Compound Semiconductor, Nov. 2003, [online].

Lantratov, V.M. et al., "Effect of the Increase of Radiation Resistance in Solar Cells with Internal Bragg Reflector," Proceedings of the State-of-the-Art Program on Compound Semiconductors, Aug. 1997, pp. 124-133, (97-21), Electrochemical Society Proceedings, Russia.

Meusal M. et al., " European Roadmap for the Development of III-V Multi-junction Space Solar Cells," 19th European Photovoltaic Solar Energy Conference, Jun. 2004, pp. 3581-3586, (7-11), Proceedings of the 19th European Photovoltaic Energy Conference, Paris, France.

Shvarts, M.Z. et al., "Radiation Resistant AIGaAs/GaAs Concentrator Solar Cells with Internal Bragg Reflector," Solar Energy Materials and Solar Cells, Apr. 2001, pp. 105-122, (68), Elsevier Science Publishers, Amsterdam.

Tobin, S.P. et al., "Enhanced Light Absorption in GaAs Solar Cells with Internal Bragg Reflectors," IEEE Photovoltaic Specialists Conference, Oct. 1991, pp. 147-152, (2-22), Proceedings of the Photovoltaic Specialists Conference, New York, U.S.

Yamaguchi, M., "Multi-junction Solar Cells and Novel Structures for Solar Cell Applications," Workshop on Nanostructures in Photovoltaics, Apr. 2002, pp. 84-90, (14), Physica E Elsevier Netherlands, Dresden, DE.

European Patent Office Search Report, Ref. P180086EP, dated Jul. 9, 2018, App. 18152275.6, No. 1230.

* cited by examiner

DISTRIBUTED BRAGG REFLECTOR STRUCTURES IN MULTIJUNCTION SOLAR CELLS

REFERENCE TO RELATED APPLICATIONS

This application is a divisional of U.S. patent application Ser. No. 15/449,590 filed Mar. 3, 2017.

This application is related to U.S. patent application Ser. No. 15/376,195 filed Dec. 12, 2016, and U.S. patent application Ser. No. 14/660,092 filed Mar. 17, 2015, which is a division of U.S. patent application Ser. No. 12/716,814 filed Mar. 3, 2010, now U.S. Pat. No. 9,018,521; which was a continuation in part of U.S. patent application Ser. No. 12/337,043 filed Dec. 17, 2008.

This application is also related to U.S. patent application Ser. No. 13/872,663 filed Apr. 29, 2013, which was also a continuation-in-part of application Ser. No. 12/337,043, filed Dec. 17, 2008.

This application is also related to U.S. patent application Ser. No. 14/828,197, filed Aug. 17, 2015.

All of the above related applications are incorporated herein by reference in their entirety.

BACKGROUND OF THE INVENTION

Field of the Invention

The present disclosure relates to solar cells and the fabrication of solar cells, and more particularly the design and specification of a lattice matched multijunction solar cells adapted for space missions.

DESCRIPTION OF THE RELATED ART

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to properly specify and manufacture. Typical commercial III-V compound semiconductor multijunction solar cells have energy efficiencies that exceed 27% under one sun, air mass 0 (AM0) illumination, whereas even the most efficient silicon technologies generally reach only about 18% efficiency under comparable conditions. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as payloads become more sophisticated, and applications anticipated for five, ten, twenty or more years, the power-to-weight ratio and lifetime efficiency of a solar cell becomes increasingly more important, and there is increasing interest not only the amount of power provided at initial deployment, but over the entire service life of the satellite system, or in terms of a design specification, the amount of power provided at the "end of life" (EOL).

Typical III-V compound semiconductor solar cells are fabricated on a semiconductor wafer in vertical, multijunction structures or stacked sequence of solar subcells, each subcell formed with appropriate semiconductor layers and including a p-n photoactive junction. Each subcell is designed to convert photons over different spectral or wavelength bands to electrical current. After the sunlight impinges on the front of the solar cell, and photons pass through the subcells, with each subcell being designed for photons in a specific wavelength band. After passing through a subcell, the photons that are not absorbed and converted to electrical energy propagate to the next subcells, where such photons are intended to be captured and converted to electrical energy.

The energy conversion efficiency of multijunction solar cells is affected by such factors as the number of subcells, the thickness of each subcell, the composition and doping of each active layer in a subcell, and the consequential band structure, electron energy levels, conduction, and absorption of each subcell, as well as the effect of its exposure to radiation in the ambient environment over time. The identification and specification of such design parameters is a non-trivial engineering undertaking, and would vary depending upon the specific space mission and customer design requirements. Since the power output is a function of both the voltage and the current produced by a subcell, a simplistic view may seek to maximize both parameters in a subcell by increasing a constituent element, or the doping level, to achieve that effect. However, in reality, changing a material parameter that increases the voltage may result in a decrease in current, and therefore a lower power output. Such material design parameters are interdependent and interact in complex and often unpredictable ways, and for that reason are not "result effective" variables that those skilled in the art confronted with complex design specifications and practical operational considerations can easily adjust to optimize performance. Electrical properties such as the short circuit current density ($J_{sc}$), the open circuit voltage ($V_{oc}$), and the fill factor (FF), which determine the efficiency and power output of the solar cell, are affected by the slightest change in such design variables, and as noted above, to further complicate the calculus, such variables and resulting properties also vary, in a non-uniform manner, over time (i.e. during the operational life of the system).

Another important mechanical or structural consideration in the choice of semiconductor layers for a solar cell is the desirability of the adjacent layers of semiconductor materials in the solar cell, i.e. each layer of crystalline semiconductor material that is deposited and grown to form a solar subcell, have similar crystal lattice constants or parameters.

SUMMARY OF THE DISCLOSURE

Objects of the Disclosure

It is an object of the present disclosure to provide increased photoconversion efficiency in a multijunction solar cell for space applications by incorporating a Bragg reflector structure between two adjacent subcells in the multijunction solar cell to reflect light in the spectral range of 900 to 1050 nm.

It is another object of the present disclosure to reduce the overall solar energy absorptance in the solar cell and provide thermodynamic radiative cooling of the solar cell when deployed in space outside the atmosphere.

It is another object of the present disclosure to provide a multijunction solar cell in which the placement of the DBR structure in the solar cell stack of layers enables reflection of power of over 190 watts per square meter out of the solar cell.

It is another object of the present disclosure to provide a multijunction solar cell in which the placement of the DBR structure in the solar cell stack of layers enables reflection of a greater amount of power than the use of an optical coating over the solar cell.

It is another object of the present invention to avoid the disadvantages of using an optical coating over the solar cell which may be affected by non-zero angles of incident light beams.

Some implementations of the present disclosure may incorporate or implement fewer of the aspects and features noted in the foregoing objects.

Features of the Invention

All ranges of numerical parameters set forth in this disclosure are to be understood to encompass any and all subranges or "intermediate generalizations" subsumed herein. For example, a stated range of "1.0 to 2.0 eV" for a band gap value should be considered to include any and all subranges beginning with a minimum value of 1.0 eV or more and ending with a maximum value of 2.0 eV or less, e.g., 1.0 to 2.0, or 1.3 to 1.4, or 1.5 to 1.9 eV.

Briefly, and in general terms, the present disclosure provides a multijunction solar cell comprising: an upper and a lower solar subcell each having an emitter layer and a base layer forming a photoelectric junction; a near infrared (NIR) wideband reflector layer disposed below the upper subcell and above the lower subcell for reflecting light in the spectral range of 900 to 1050 nm which represents unused and undesired solar energy and thereby reducing the overall solar energy absorptance in the solar cell and providing thermodynamic radiative cooling of the solar cell when deployed in space outside the atmosphere; the layer including a distributed Bragg reflector (DBR) structure disposed beneath the base layer of the upper solar subcell and composed of a plurality of alternating layers of different semiconductor materials with discontinuities in their respective indices of refraction and arranged so that light can enter and pass through the upper solar subcell and at least a first portion of the light in a first spectral wavelength range can be reflected back into the upper solar subcell and out of the solar cell by the DBR structure, and a second portion of the light in a second spectral wavelength can be transmitted through the DBR structure to the layers disposed beneath the DBR structure, wherein the second spectral wavelength range is greater than 1050 nm.

In some embodiments, the upper solar subcell is composed of indium gallium arsenide, and the lower solar subcell is composed of germanium In some embodiments, the fourth subcell is InGaAs, GaAsSb, InAsP, InAlAs, or SiGeSn, InGaAsN, InGaAsNSb, InGaAsNBi, InGaAsNSbBi, InGaSbN, InGaBiN, InGaSbBiN.

In some embodiments, the fourth subcell has a band gap of approximately 0.67 eV, the third subcell has a band gap of approximately 1.41 eV, the second subcell has a band gap in the range of approximately 1.65 to 1.8 eV and the upper first subcell has a band gap in the range of 2.0 to 2.2 eV.

In some embodiments, the second subcell has a band gap of approximately 1.73 eV and the upper first subcell has a band gap of approximately 2.10 eV.

In some embodiments, the upper first subcell is composed of indium gallium aluminum phosphide; the second solar subcell includes an emitter layer composed of indium gallium phosphide or aluminum gallium arsenide, and a base layer composed of aluminum gallium arsenide; the third solar subcell is composed of indium gallium arsenide; and the fourth subcell is composed of germanium.

In some embodiments, the distributed Bragg reflector (DBR) structure is disposed adjacent to and between the middle and bottom solar subcells and arranged so that light can enter and pass through the middle solar subcell and at least a portion of which can be reflected back into the middle and upper solar subcell and out of the solar cell by the DBR structure.

In some embodiments, each of the distributed Bragg reflector structures are composed of a plurality of alternating layers of lattice matched materials with discontinuities in their respective indices of refraction.

In some embodiments, at least some of the layers of at least one of the distributed Bragg reflector structures is composed of a plurality of alternating layers of different lattice constant.

In some embodiments, at least some of the layers of the distributed Bragg reflector structures are composed of a plurality of alternating layers having different doping levels and/or different dopant materials.

In some embodiments, at least some of the layers of the distributed Bragg reflector structures are composed of a plurality of alternating layers of different thicknesses.

In some embodiments, the difference in refractive indices between alternating layers is maximized in order to minimize the number of periods required to achieve a given reflectivity, and the thickness and refractive index of each period determines the stop band and its limiting wavelength.

In some embodiments, each of the distributed Bragg reflector structures are composed of a plurality of alternating layers that includes a first DBR layer composed of an n type or p type $Al_xGa_{1-x}As$ layer, and a second adjacent DBR layer disposed over the first DBR layer and composed of an n or p type $Al_yGa_{1-y}As$ layer, $0<x<1$, $0<y<1$, and where y is greater than x.

In some embodiments, additional layer(s) may be added or deleted in the cell structure without departing from the scope of the present disclosure.

Some implementations of the present disclosure may incorporate or implement fewer of the aspects and features noted in the foregoing summaries.

Additional aspects, advantages, and novel features of the present disclosure will become apparent to those skilled in the art from this disclosure, including the following detailed description as well as by practice of the disclosure. While the disclosure is described below with reference to preferred embodiments, it should be understood that the disclosure is not limited thereto. Those of ordinary skill in the art having access to the teachings herein will recognize additional applications, modifications and embodiments in other fields, which are within the scope of the disclosure as disclosed and claimed herein and with respect to which the disclosure could be of utility.

BRIEF DESCRIPTION OF THE DRAWINGS

The invention will be better and more fully appreciated by reference to the following detailed description when considered in conjunction with the accompanying drawings, wherein.

GLOSSARY OF TERMS

Figure 1A:
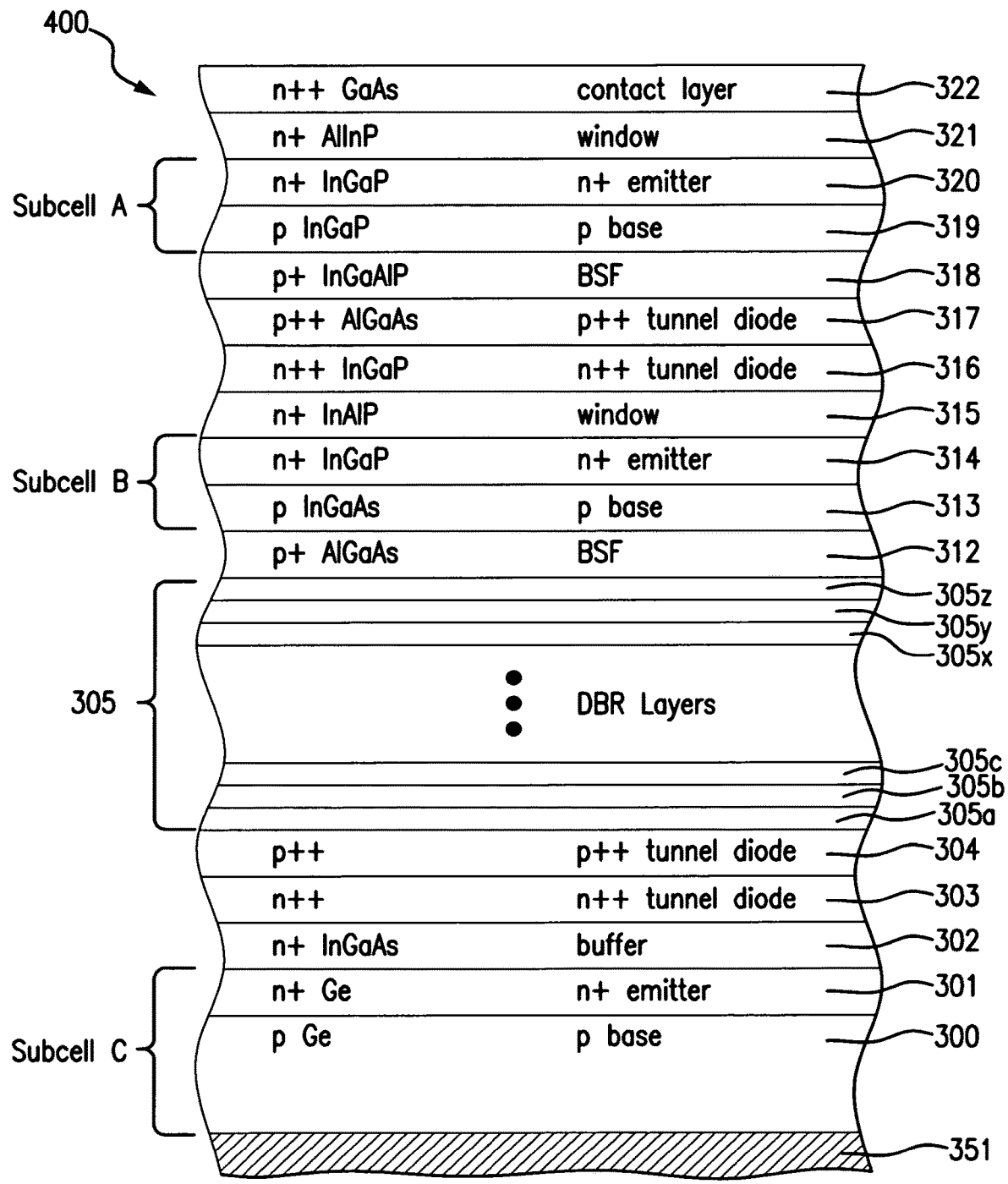
FIG. 1A is a cross-sectional view of a three junction solar cell after several stages of fabrication including the deposition of certain semiconductor layers on the growth substrate, according to a first embodiment of the present disclosure.

"III-V compound semiconductor" refers to a compound semiconductor formed using at least one elements from group III of the periodic table and at least one element from group V of the periodic table. III-V compound semiconductors include binary, tertiary and quaternary compounds. Group III includes boron (B), aluminum (Al), gallium (Ga), indium (In) and thallium (T). Group V includes nitrogen (N), phosphorus (P), arsenic (As), antimony (Sb) and bismuth (Bi).

"Band gap" refers to an energy difference (e.g., in electron volts (eV)) separating the top of the valence band and the bottom of the conduction band of a semiconductor material.

"Beginning of Life (BOL)" refers to the time at which a photovoltaic power system is initially deployed in operation.

"Bottom subcell" refers to the subcell in a multijunction solar cell which is furthest from the primary light source for the solar cell.

"Compound semiconductor" refers to a semiconductor formed using two or more chemical elements.

"Current density" refers to the short circuit current density $J_{sc}$ through a solar subcell through a given planar area, or volume, of semiconductor material constituting the solar subcell.

"Deposited", with respect to a layer of semiconductor material, refers to a layer of material which is epitaxially grown over another semiconductor layer.

"End of Life (EOL)" refers to a predetermined time or times after the Beginning of Life, during which the photovoltaic power system has been deployed and has been operational. The EOL time or times may, for example, be specified by the customer as part of the required technical performance specifications of the photovoltaic power system to allow the solar cell designer to define the solar cell subcells and sublayer compositions of the solar cell to meet the technical performance requirement at the specified time or times, in addition to other design objectives. The terminology "EOL" is not meant to suggest that the photovoltaic power system is not operational or does not produce power after the EOL time.

"Graded interlayer" (or "grading interlayer")—see "metamorphic layer".

"Inverted metamorphic multijunction solar cell" or "IMM solar cell" refers to a solar cell in which the subcells are deposited or grown on a substrate in a "reverse" sequence such that the higher band gap subcells, which would normally be the "top" subcells facing the solar radiation in the final deployment configuration, are deposited or grown on a growth substrate prior to depositing or growing the lower band gap subcells.

"Layer" refers to a relatively planar sheet or thickness of semiconductor or other material. The layer may be deposited or grown, e.g., by epitaxial or other techniques.

"Lattice mismatched" refers to two adjacently disposed materials or layers (with thicknesses of greater than 100 nm) having in—plane lattice constants of the materials in their fully relaxed state differing from one another by less than 0.02% in lattice constant. (Applicant expressly adopts this definition for the purpose of this disclosure, and notes that this definition is considerably more stringent than that proposed, for example, in U.S. Pat. No. 8,962,993, which suggests less than 0.6% lattice constant difference).

"Metamorphic layer" or "graded interlayer" refers to a layer that achieves a gradual transition in lattice constant generally throughout its thickness in a semiconductor structure.

"Middle subcell" refers to a subcell in a multijunction solar cell which is neither a Top Subcell (as defined herein) nor a Bottom Subcell (as defined herein).

"Short circuit current ($I_{sc}$)" refers to the amount of electrical current through a solar cell or solar subcell when the voltage across the solar cell is zero volts, as represented and measured, for example, in units of milliamps.

"Short circuit current density"—see "current density".

"Solar cell" refers to an electronic device operable to convert the energy of light directly into electricity by the photovoltaic effect.

"Solar cell assembly" refers to two or more solar cell subassemblies interconnected electrically with one another.

"Solar cell subassembly" refers to a stacked sequence of layers including one or more solar subcells.

"Solar subcell" refers to a stacked sequence of layers including a p-n photoactive junction composed of semiconductor materials. A solar subcell is designed to convert photons over different spectral or wavelength bands to electrical current.

"Substantially current matched" refers to the short circuit current through adjacent solar subcells being substantially identical (i.e. within plus or minus 1%).

"Top subcell" or "upper subcell" refers to the subcell in a multijunction solar cell which is closest to the primary light source for the solar cell.

"ZTJ" refers to the product designation of a commercially available SolAero Technologies Corp. triple junction solar cell.

DESCRIPTION OF THE PREFERRED EMBODIMENT

Details of the present invention will now be described including exemplary aspects and embodiments thereof.

Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

A variety of different features of multijunction solar cells (as well as inverted metamorphic multijunction solar cells) are disclosed in the related applications noted above. Some, many or all of such features may be included in the structures and processes associated with the lattice matched or "upright" solar cells of the present disclosure. However, more particularly, the present disclosure is directed to the fabrication of a multijunction lattice matched solar cell with specific DBR structures grown between subcells.

Prior to discussing the specific embodiments of the present disclosure, a brief discussion of some of the issues associated with the design of multijunction solar cells, and the context of the composition or deposition of various specific layers in embodiments of the product as specified and defined by Applicant is in order.

There are a multitude of properties that should be considered in specifying and selecting the composition of, inter alia, a specific semiconductor layer, the back metal layer, the adhesive or bonding material, or the composition of the supporting material for mounting a solar cell thereon. For example, some of the properties that should be considered when selecting a particular layer or material are electrical properties (e.g. conductivity), optical properties (e.g., band gap, absorbance and reflectance), structural properties (e.g., thickness, strength, flexibility, Young's modulus, etc.), chemical properties (e.g., growth rates, the "sticking coefficient" or ability of one layer to adhere to another, stability of dopants and constituent materials with respect to adjacent layers and subsequent processes, etc.), thermal properties (e.g., thermal stability under temperature changes, coefficient of thermal expansion), and manufacturability (e.g., availability of materials, process complexity, process variability and tolerances, reproducibility of results over high volume, reliability and quality control issues).

In view of the trade-offs among these properties, it is not always evident that the selection of a material based on one of its characteristic properties is always or typically "the best" or "optimum" from a commercial standpoint or for Applicant's purposes. For example, theoretical studies may suggest the use of a quaternary material with a certain band gap for a particular subcell would be the optimum choice for that subcell layer based on fundamental semiconductor physics. As an example, the teachings of academic papers and related proposals for the design of very high efficiency (over 40%) solar cells may therefore suggest that a solar cell designer specify the use of a quaternary material (e.g., InGaAsP) for the active layer of a subcell. A few such devices may actually be fabricated by other researchers, efficiency measurements made, and the results published as an example of the ability of such researchers to advance the progress of science by increasing the demonstrated efficiency of a compound semiconductor multijunction solar cell. Although such experiments and publications are of "academic" interest, from the practical perspective of the Applicants in designing a compound semiconductor multijunction solar cell to be produced in high volume at reasonable cost and subject to manufacturing tolerances and variability inherent in the production processes, such an "optimum" design from an academic perspective is not necessarily the most desirable design in practice, and the teachings of such studies more likely than not point in the wrong direction and lead away from the proper design direction. Stated another way, such references may actually "teach away" from Applicant's research efforts and direction and the ultimate solar cell design proposed by the Applicants.

In view of the foregoing, it is further evident that the identification of one particular constituent element (e.g. indium, or aluminum) in a particular subcell, or the thickness, band gap, doping, or other characteristic of the incorporation of that material in a particular subcell, is not a single "result effective variable" that one skilled in the art can simply specify and incrementally adjust to a particular level and thereby increase the power output and efficiency of a solar cell.

Even when it is known that particular variables have an impact on electrical, optical, chemical, thermal or other characteristics, the nature of the impact often cannot be predicted with much accuracy, particularly when the variables interact in complex ways, leading to unexpected results and unintended consequences. Thus, significant trial and error, which may include the fabrication and evaluative testing of many prototype devices, often over a period of time of months if not years, is required to determine whether a proposed structure with layers of particular compositions, actually will operate as intended, let alone whether it can be fabricated in a reproducible high volume manner within the manufacturing tolerances and variability inherent in the production process, and necessary for the design of a commercially viable device.

Furthermore, as in the case here, where multiple variables interact in unpredictable ways, the proper choice of the combination of variables can produce new and unexpected results, and constitute an "inventive step".

The efficiency of a solar cell is not a simple linear algebraic equation as a function of the amount of gallium or aluminum or other element in a particular layer. The growth of each of the epitaxial layers of a solar cell in a reactor is a non-equilibrium thermodynamic process with dynamically changing spatial and temporal boundary conditions that is not readily or predictably modeled. The formulation and solution of the relevant simultaneous partial differential equations covering such processes are not within the ambit of those of ordinary skill in the art in the field of solar cell design.

More specifically, the present disclosure intends to provide a relatively simple and reproducible technique that does not employ inverted processing associated with inverted metamorphic multijunction solar cells, and is suitable for use in a high volume production environment in which various semiconductor layers are grown on a growth substrate in an MOCVD reactor, and subsequent processing steps are defined and selected to minimize any physical damage to the quality of the deposited layers, thereby ensuring a relatively high yield of operable solar cells meeting specifications at the conclusion of the fabrication processes.

The lattice constants and electrical properties of the layers in the semiconductor structure are preferably controlled by specification of appropriate reactor growth temperatures and times, and by use of appropriate chemical composition and dopants. The use of a deposition method, such as Molecular Beam Epitaxy (MBE), Organo Metallic Vapor Phase Epitaxy (OMVPE), Metal Organic Chemical Vapor Deposition (MOCVD), or other vapor deposition methods for the growth may enable the layers in the monolithic semiconductor structure forming the cell to be grown with the required thickness, elemental composition, dopant concentration and grading and conductivity type, and are within the scope of the present disclosure.

The present disclosure is in one embodiment directed to a growth process using a metal organic chemical vapor deposition (MOCVD) process in a standard, commercially available reactor suitable for high volume production. Other embodiments may use other growth technique, such as MBE. More particularly, regardless of the growth technique, the present disclosure is directed to the materials and fabrication steps that are particularly suitable for producing commercially viable multijunction solar cells or inverted metamorphic multijunction solar cells using commercially available equipment and established high-volume fabrication processes, as contrasted with merely academic expositions of laboratory or experimental results.

Some comments about MOCVD processes used in one embodiment are in order here.

It should be noted that the layers of a certain target composition in a semiconductor structure grown in an MOCVD process are inherently physically different than the layers of an identical target composition grown by another process, e.g. Molecular Beam Epitaxy (MBE). The material quality (i.e., morphology, stoichiometry, number and location of lattice traps, impurities, and other lattice defects) of an epitaxial layer in a semiconductor structure is different depending upon the process used to grow the layer, as well as the process parameters associated with the growth. MOCVD is inherently a chemical reaction process, while MBE is a physical deposition process. The chemicals used in the MOCVD process are present in the MOCVD reactor and interact with the wafers in the reactor, and affect the composition, doping, and other physical, optical and electrical characteristics of the material. For example, the precursor gases used in an MOCVD reactor (e.g. hydrogen) are incorporated into the resulting processed wafer material, and have certain identifiable electro-optical consequences which are more advantageous in certain specific applications of the semiconductor structure, such as in photoelectric conversion in structures designed as solar cells. Such high order effects of processing technology do result in relatively minute but actually observable differences in the material quality grown or deposited according to one process technique compared to another. Thus, devices fabricated at least in part using an MOCVD reactor or using a MOCVD process have inherent different physical material characteristics, which may have an advantageous effect over the identical target material deposited using alternative processes.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

FIG. 1A illustrates a particular example of an embodiment of a three junction solar cell 400 after several stages of fabrication including the growth of certain semiconductor layers on the growth substrate up to the contact layer 322 as provided by the present disclosure.

As shown in the illustrated example of FIG. 1A, the bottom subcell C includes a substrate 300 formed of p-type germanium ("Ge") which also serves as a base layer. A back metal contact to the multijunction pad 351 formed on the bottom of base layer 300 provides electrical contact to the multijunction solar cell 400. The bottom subcell C, further includes, for example, a highly doped n-type Ge emitter layer 301, and an n-type indium gallium arsenide ("InGaAs") nucleation layer 302. The nucleation layer is deposited over the base layer, and the emitter layer is formed in the substrate by diffusion of deposits into the Ge substrate, thereby forming the n-type Ge layer 301. Heavily doped p-type aluminum gallium arsenide ("AlGaAs") and heavily doped n-type gallium arsenide ("GaAs") tunneling junction layers 303, 304 may be deposited over the nucleation layer to provide a low resistance pathway between the bottom and middle subcells.

A Distributed Bragg reflector (DBR) structure consisting of layers 305 (specifically, individual layers 305a through 305z) are then grown adjacent to and between the tunnel diode 303, 304 of the bottom subcell C and the second solar subcell B. The DBR layers 305 are arranged so that light can enter and pass through the third solar subcell B and DBR structure 306 and at least a portion of which can be reflected back into the second solar subcell B by the DBR layers 305. In the embodiment depicted in FIG. 3A, the distributed Bragg reflector (DBR) layers 305 are specifically located between the second solar subcell B/DBR structure 306 and tunnel diode layers 304, 303; in other embodiments, the distributed Bragg reflector (DBR) layers may be located between tunnel diode layers 304/303 and buffer layer 302.

For some embodiments, distributed Bragg reflector (DBR) layers 305 can be composed of a plurality of alternating layers 305a through 305z, respectively, of lattice matched materials with discontinuities in their respective indices of refraction. For certain embodiments, the difference in refractive indices between alternating layers is maximized in order to minimize the number of periods required to achieve a given reflectivity, and the thickness and refractive index of each period determines the stop band and its limiting wavelength.

For some embodiments, distributed Bragg reflector (DBR) layers 305a through 305z, includes a first DBR layer composed of a plurality of p type $Al_xGa_{1-x}As$ layers, and a second DBR layer disposed over the first DBR layer and composed of a plurality of n or p type $Al_yGa_{1-y}As$ layers, where $0<x<1$, $0<y<1$, and y is greater than x.

In the illustrated example of FIG. 1A, the subcell B includes a highly doped p-type aluminum gallium arsenide ("AlGaAs") back surface field ("BSF") layer 312, a p-type AlGaAs base layer 313, a highly doped n-type indium gallium phosphide ("InGaP") or AlGaAs emitter layer 314 and a highly doped n-type indium gallium aluminum phosphide ("InGaAlP") window layer 315. Other compositions may be used as well. The base layer 313 is formed over the BSF layer 312 after the BSF layer 312 is deposited over the DBR layers 306.

The window layer 315 helps reduce the recombination loss and improves passivation of the cell surface of the underlying junctions.

Before depositing the layers of the top cell A, heavily doped n-type InGaP and p-type AlGaAs tunneling junction layers 316, 317 may be deposited over the subcell B.

In the illustrated example, the top subcell A includes a highly doped p-type indium aluminum phosphide ("InAlP$_2$") BSF layer 318, a p-type InGaAlP base layer 319, a highly doped n-type InGaAlP emitter layer 320 and a highly doped n-type InAlP$_2$ window layer 321.

A cap or contact layer 322 of GaAs is deposited over the window layer 321 and the grid lines are formed via evaporation and lithographically patterned and deposited over the cap or contact layer 322.

Figure 1B:
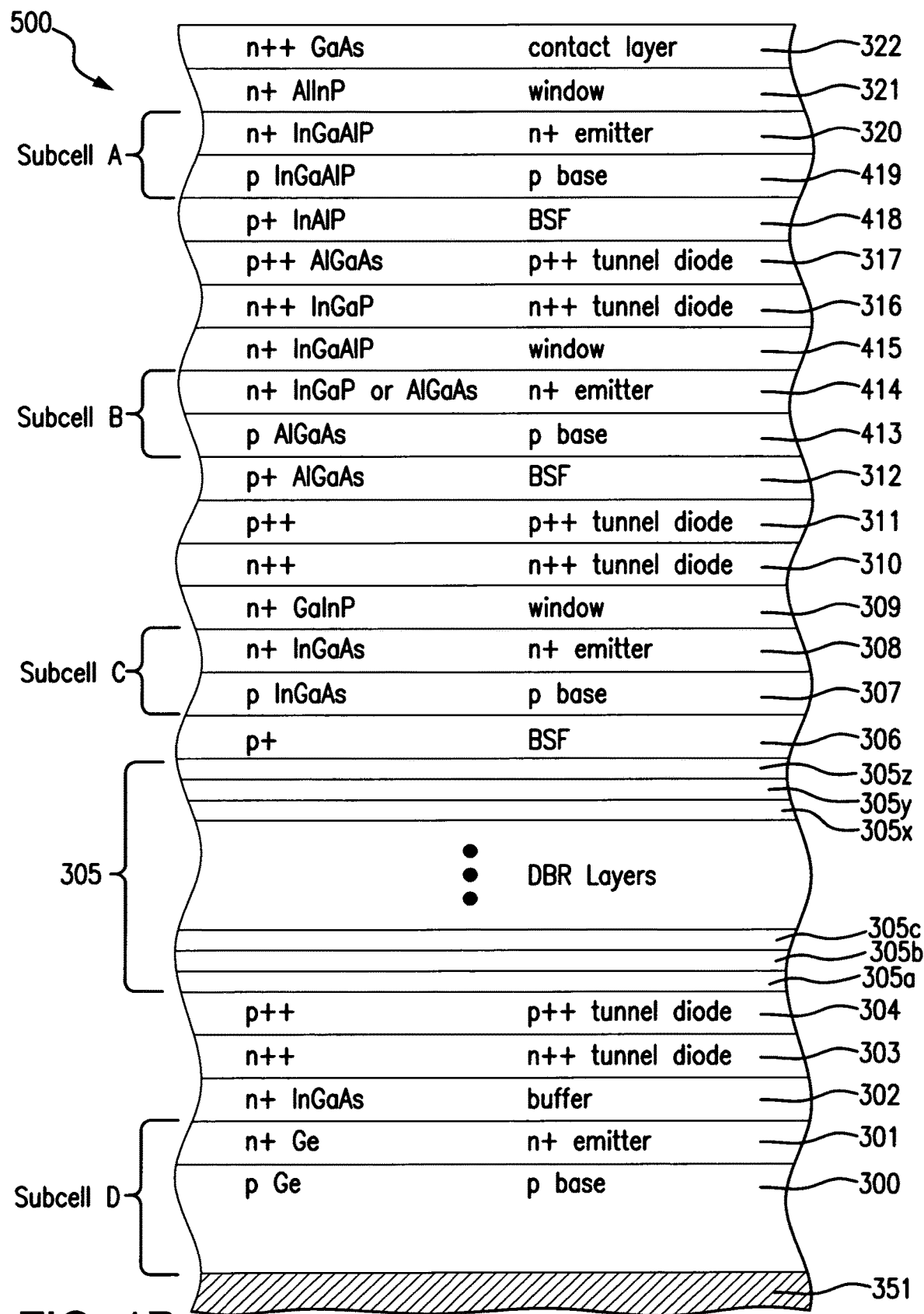
FIG. 1B is a cross-sectional view of a four junction solar cell after several stages of fabrication including the deposition of certain semiconductor layers on the growth substrate, according to a second embodiment of the present disclosure.

Turning to another embodiment of the multijunction solar cell device of the present disclosure, FIG. 1B is a cross-sectional view of an embodiment of a four junction solar cell 500 after several stages of fabrication including the growth of certain semiconductor layers on the growth substrate up to the contact layer 322, with various layers and subcells being similar to the structure described and depicted in FIG. 1A.

The second embodiment depicted in FIG. 1B is similar to that of the first embodiment depicted in FIG. 1A except that an additional middle subcell, subcell C, including layers 307 through 311 is now included, and since the other layers in FIG. 1B are substantially identical to that of layers in FIG. 1A, the description of such layers will not be repeated here for brevity.

In the illustrated example of FIG. 1B, the subcell C includes a highly doped p-type aluminum gallium arsenide ("AlGaAs") back surface field ("BSF") layer 306, a p-type InGaAs base layer 307, a highly doped n-type indium gallium arsenide ("InGaAs") emitter layer 308b and a highly doped n-type indium aluminum phosphide ("AlInP$_2$") or indium gallium phosphide ("GaInP") window layer 309. The InGaAs base layer 307 of the subcell C can include, for example, approximately 1.5% In. Other compositions may be used as well. The base layer is formed over the BSF layer 306 after the BSF layer 306 is deposited over the DBR layers 305.

The window layer 309 is deposited on the emitter layer 308 of the subcell C. The window layer 309 in the subcell C also helps reduce the recombination loss and improves passivation of the cell surface of the underlying junctions. Before depositing the layers of the subcell C, heavily doped n-type InGaP and p-type AlGaAs (or other suitable compositions) tunneling junction layers 310, 311 may be deposited over the subcell C.

Figure 2A:
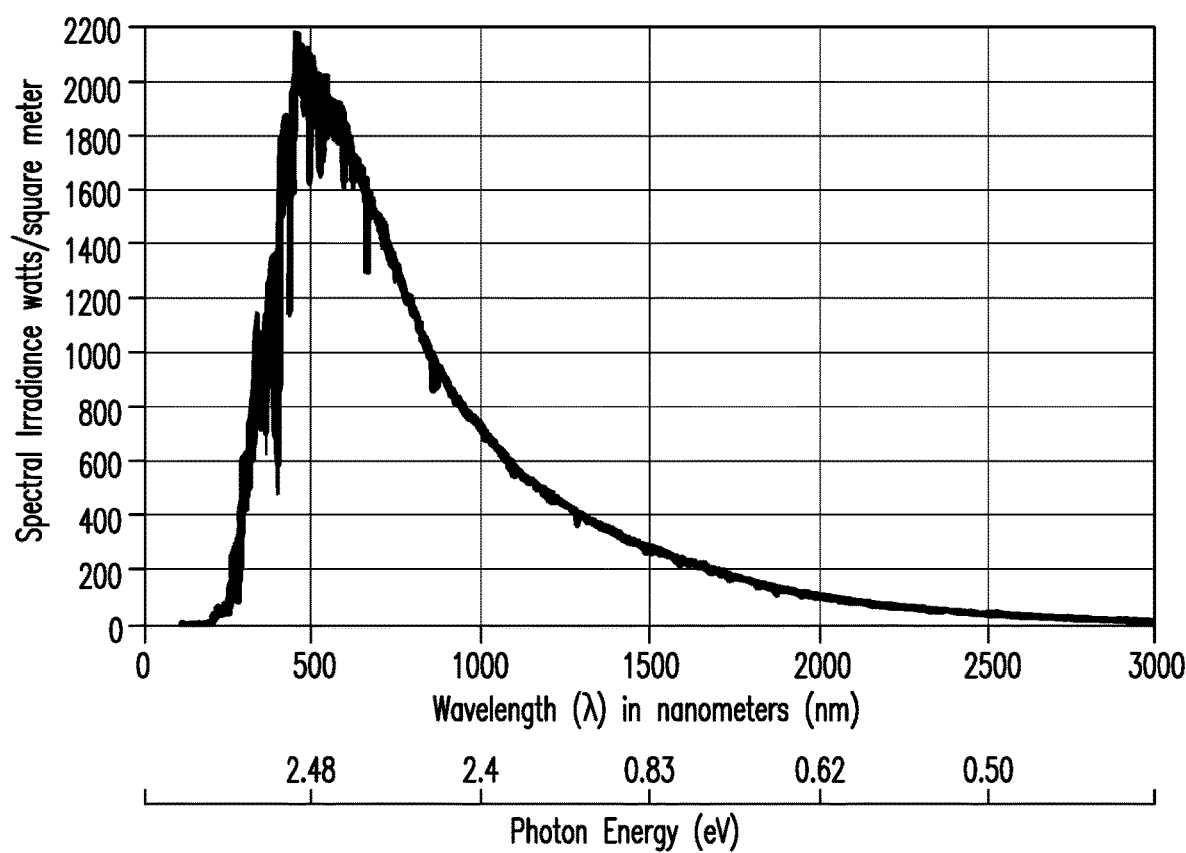
FIG. 2A is a graph of the spectral irradiance in watts per square meter in AM0 versus the wavelength of the light.

FIG. 2A is a graph of the spectral irradiance in watts per square meter in AM0 versus the wavelength of the light.

Figure 2B:
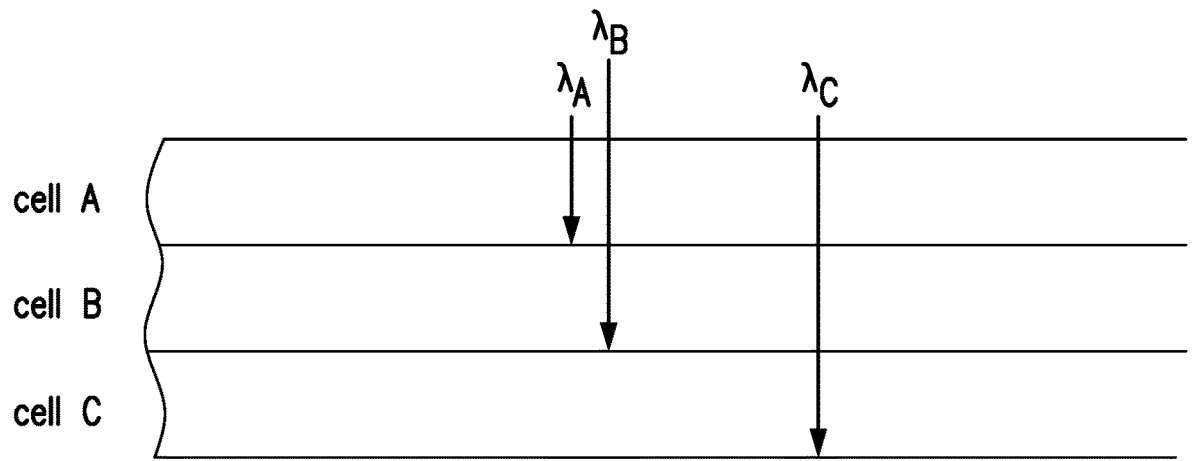
FIG. 2B is a schematic representation of photons of three different wavelengths being absorbed by, or being transmitted through, different subcells in a three junction tandem solar cell.

FIG. 2B is a schematic representation of photons of three different wavelengths corresponding to the x-axis representation of wavelength (or photon energy) depicted in FIG. 2A, such photons being absorbed by, or being transmitted through, different subcells in a three junction tandem solar cell such as the solar cell of FIG. 1A. In this particular representation the light wavelengths $\lambda_C > \lambda_B > \lambda_A$. The top subcell A is designed to absorb light of wavelength $\lambda_A$, the middle subcell is designed to absorb light of wavelength $\lambda_B$, and the bottom subcell is designed to absorb light of wavelength $\lambda_C$.

Figure 2C:
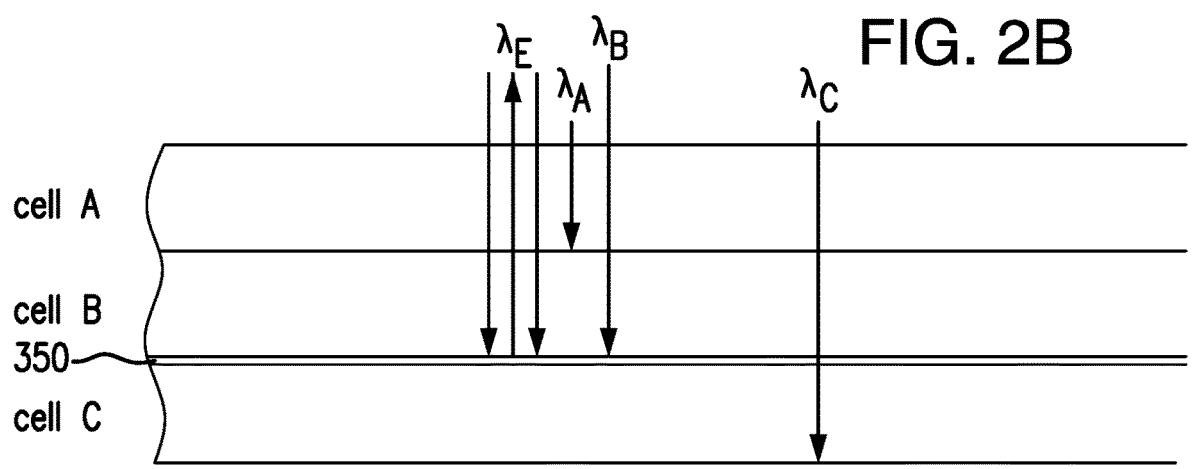
FIG. 2C is a schematic representation of photons of different wavelengths being absorbed by, or being transmitted through, different subcells in a three junction tandem solar cell with a single DBR structure according to the present disclosure.

FIG. 2C is a schematic representation of photons of different wavelengths being absorbed by, or being transmitted through, different subcells in a three junction tandem solar cell with a single DBR structure 350 disposed under subcell B according to the present disclosure.

In this particular representation the light wavelengths $\lambda_E > \lambda_C > \lambda_B > \lambda_A$. The top subcell A is designed to absorb light of wavelength $\lambda_A$, the middle subcell is designed to absorb light of wavelength $\lambda_B$, and the bottom subcell is designed to absorb light of wavelength $\lambda_C$. The DBR structure 350 reflects the light of wavelength $\lambda_E$ back through subcells B and A and out of the solar cell.

Figure 2D:
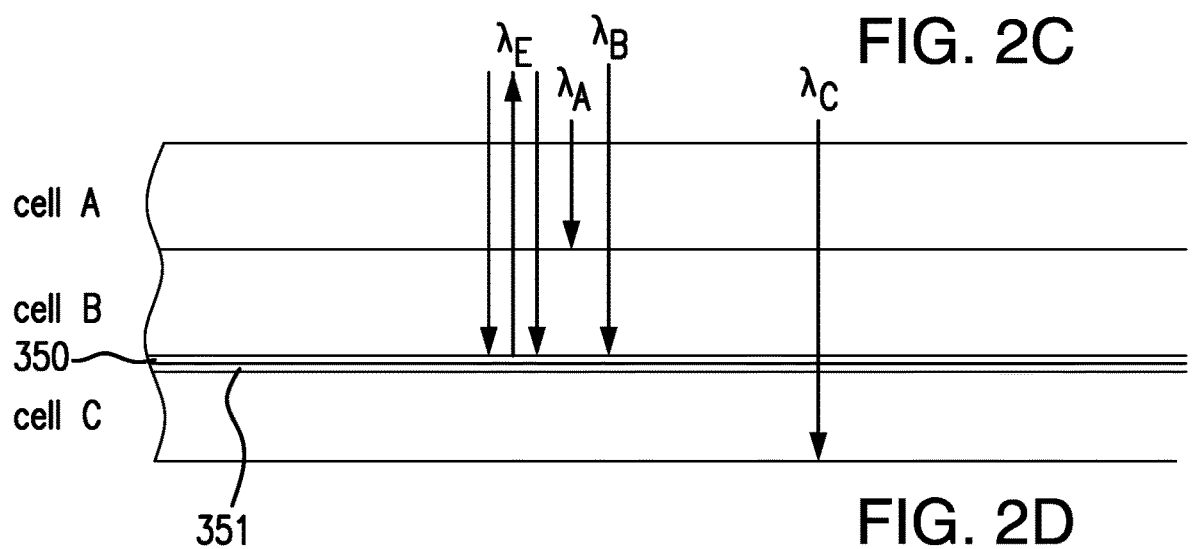
FIG. 2D is a schematic representation of photons of different wavelengths being absorbed by, or being transmitted through, different subcells in a three junction tandem solar cell with two DBR structures (DBR-1 and DBR-2) according to the present disclosure.

FIG. 2D is a schematic representation of photons of different wavelengths being absorbed by, or being transmitted through, different subcells in a three junction tandem solar cell with two DBR structures (DBR-1 350 and DBR-2 351) according to the present disclosure. In this particular representation the light wavelengths $\lambda_E > \lambda_C > \lambda_B > \lambda_A$. The top subcell A is designed to absorb light of wavelength $\lambda_A$, the middle subcell is designed to absorb light of wavelength $\lambda_B$, and the bottom subcell is designed to absorb light of wavelength $\lambda_C$. The DBR structure 350 reflects the light of wavelength $\lambda_E$ back through subcells B and A and out of the solar cell.

In the illustrated embodiment of FIG. 2D, the second DBR structure 351 is located directly below that of DBR structure 350. In other embodiments, the DBR structure 357 may be located directly above the DBR structure 350.

Figure 2E:
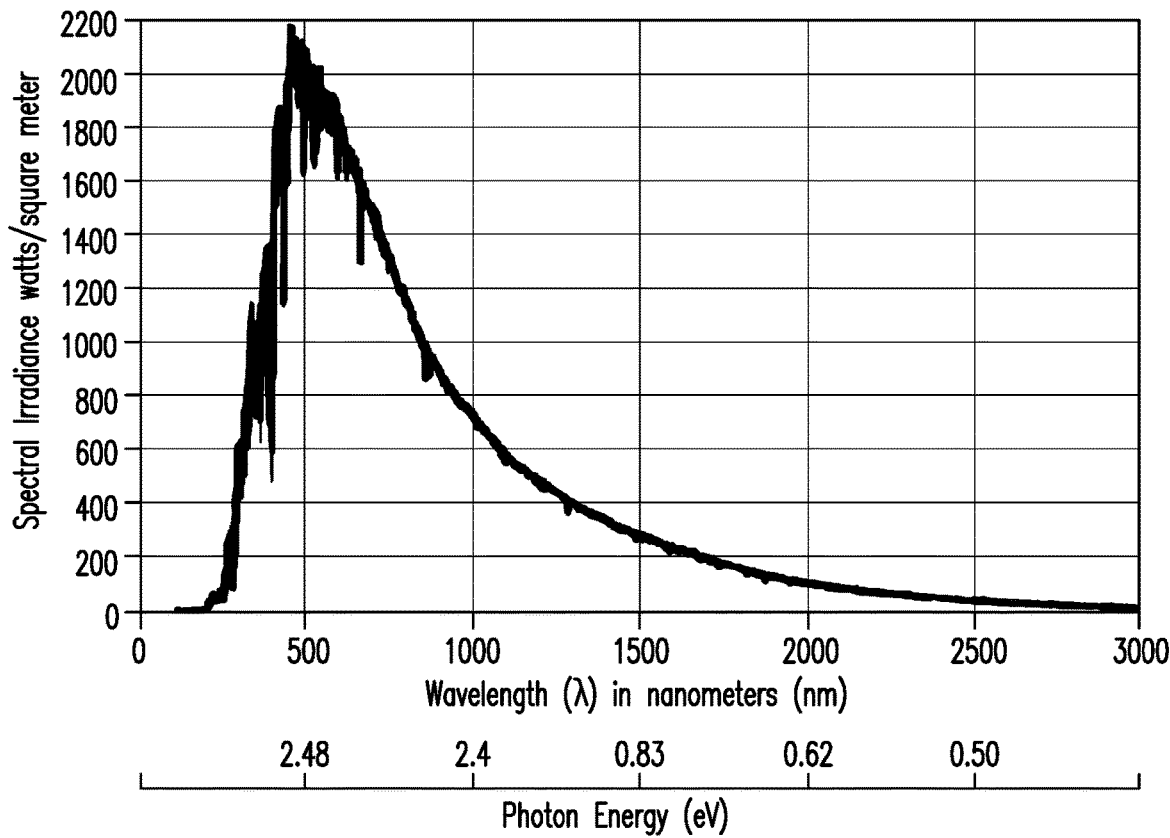
FIG. 2E is a schematic representation of photons of different wavelengths being absorbed by, or being transmitted through, different subcells in a four junction tandem solar cell with a single DBR structure (DBR-1) according to the present disclosure.
Figure 2E:
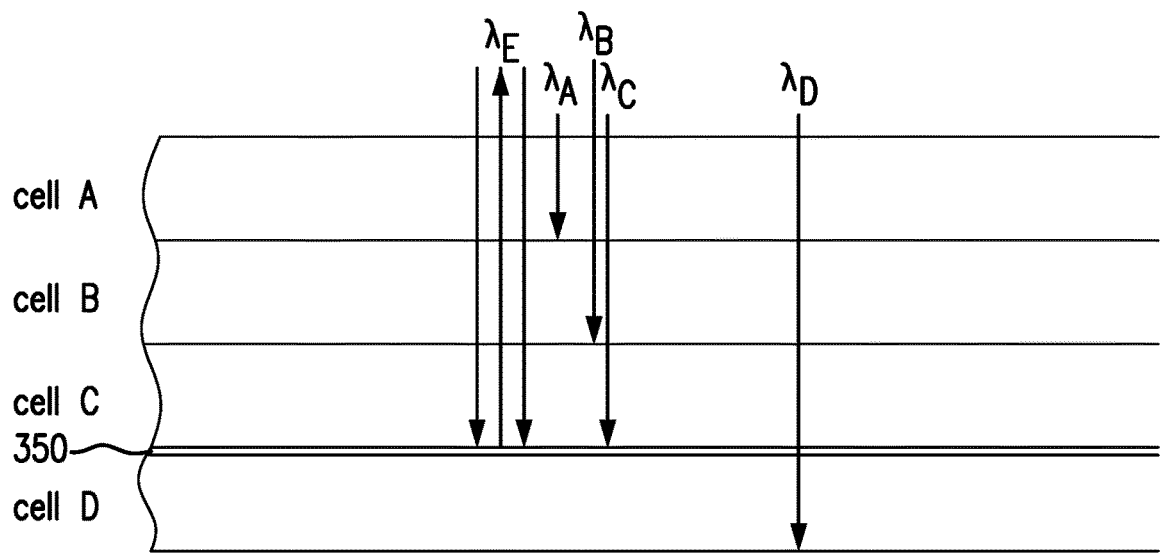

FIG. 2E is a schematic representation of photons of different wavelengths being absorbed by, or being transmitted through, different subcells in a four junction tandem solar cell with a single DBR structure (DBR-1) according to the present disclosure.

In this particular representation, the light wavelengths $\lambda_D > \lambda_E > \lambda_C > \lambda_B > \lambda_A$. The top subcell A is designed to absorb light of wavelength $\lambda_A$, the first middle subcell is designed to absorb light of wavelength $\lambda_B$, and the second middle subcell is designed to absorb light of wavelength $\lambda_C$, and the bottom subcell is designed to absorb light of wavelength $\lambda_D$. The DBR structure 350 reflects the light of wavelength $\lambda_E$ back through subcells B and A and out of the solar cell.

Figure 3A:
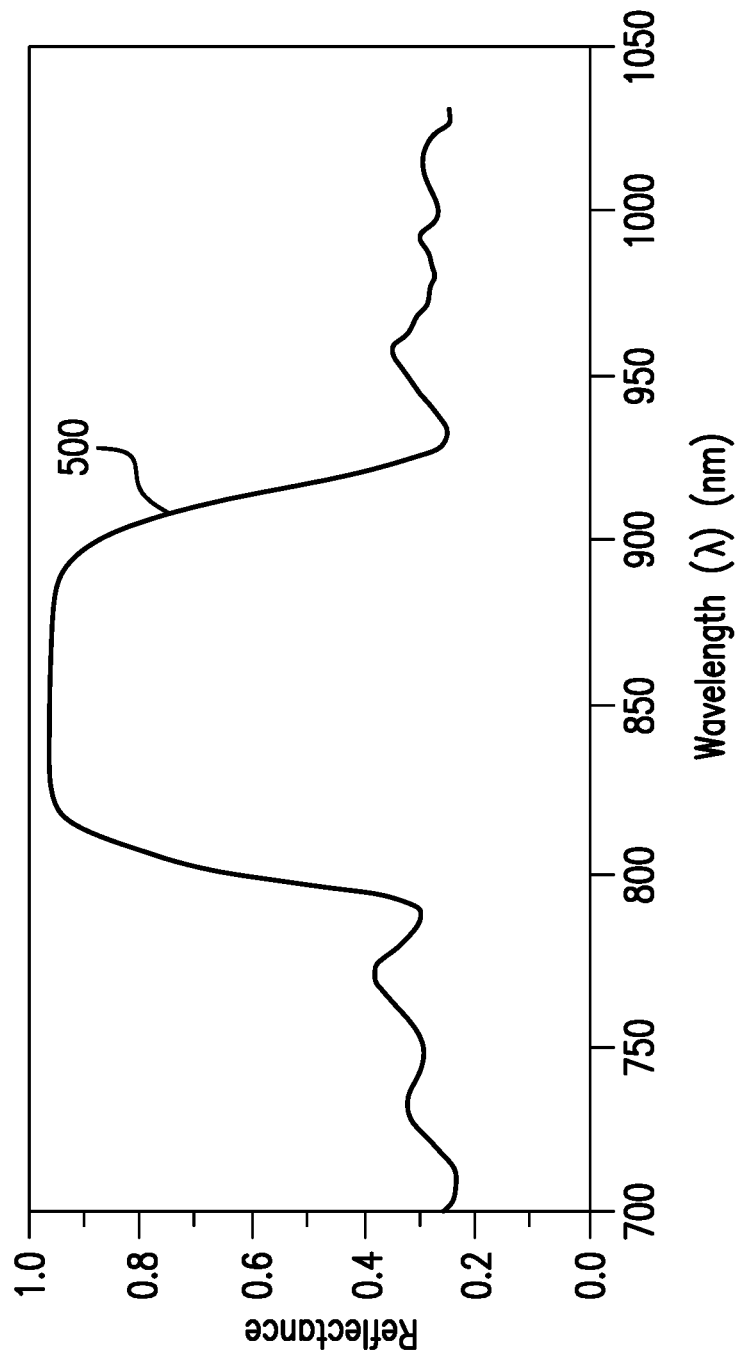
FIG. 3A is a graph of the reflectance of a single distributed Bragg reflector structure as a function of wavelength such as known in the prior art.

FIG. 3A is a graph 500 of the reflectance of a single distributed Bragg reflector structure as a function of wavelength such as known in the prior art.

Figure 3B:
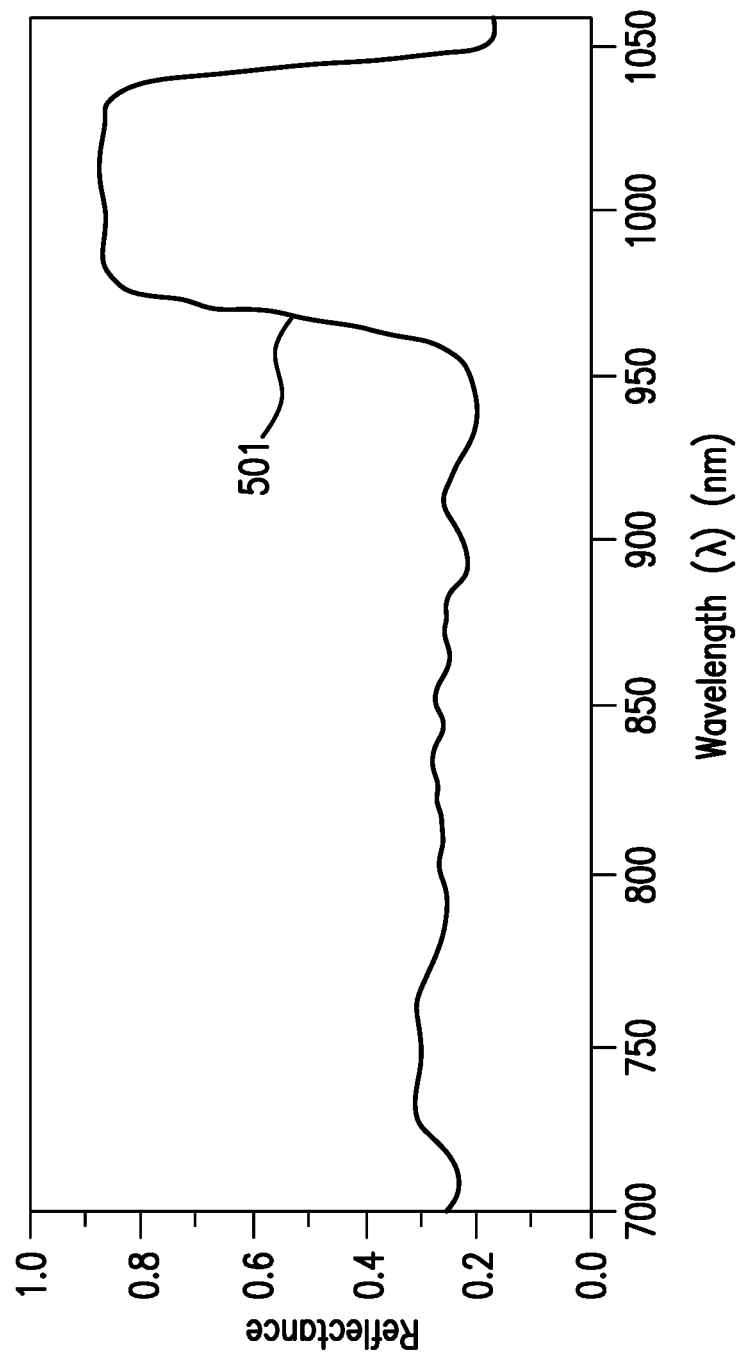
FIG. 3B is a graph of the reflectance of the distributed Bragg reflector structure according to the present disclosure.

FIG. 3B is a graph 501 of the reflectance of the distributed Bragg reflector structure according to the present disclosure.

The use of the DBR structure with a 950 nm center according to the present disclosure results in a reflection power of over 190 watts per square meter, and a corresponding lowering of the temperature of the solar cell in excess of about 4.9 degrees Centigrade.

It will be understood that each of the elements described above, or two or more together, also may find a useful application in other types of structures or constructions differing from the types of structures or constructions described above.

Although described embodiments of the present disclosure utilizes a vertical stack of three subcells, various aspects and features of the present disclosure can apply to stacks with fewer or greater number of subcells, i.e. two junction cells, three junction cells, five, six, seven junction cells, etc.

In addition, although the disclosed embodiments are configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

As noted above, the solar cell described in the present disclosure may utilize an arrangement of one or more, or all, homojunction cells or subcells, i.e., a cell or subcell in which the p-n junction is formed between a p-type semiconductor and an n-type semiconductor both of which have the same chemical composition and the same band gap, differing only in the dopant species and types, and one or more heterojunction cells or subcells. Subcell 309, with p-type and n-type InGaP is one example of a homojunction subcell.

In some cells, a thin so-called "intrinsic layer" may be placed between the emitter layer and base layer, with the same or different composition from either the emitter or the base layer. The intrinsic layer may function to suppress minority-carrier recombination in the space-charge region. Similarly, either the base layer or the emitter layer may also be intrinsic or not-intentionally-doped ("NID") over part or all of its thickness.

The composition of the window or BSF layers may utilize other semiconductor compounds, subject to lattice constant and band gap requirements, and may include AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, ZnSSe, CdSSe, and similar materials, and still fall within the spirit of the present invention.

While the solar cell described in the present disclosure has been illustrated and described as embodied in a conventional multijunction solar cell, it is not intended to be limited to the details shown, since it is also applicable to inverted metamorphic solar cells, and various modifications and structural changes may be made without departing in any way from the spirit of the present invention.

Thus, while the description of the semiconductor device described in the present disclosure has focused primarily on solar cells or photovoltaic devices, persons skilled in the art know that other optoelectronic devices, such as thermophotovoltaic (TPV) cells, photodetectors and light-emitting diodes (LEDS), are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand LEDs can also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

Without further analysis, from the foregoing others can, by applying current knowledge, readily adapt the present invention for various applications. Such adaptations should and are intended to be comprehended within the meaning and range of equivalence of the following claims.

The invention claimed is:

1. A method of forming a multijunction solar cell comprising:
    forming an upper and a lower solar subcell each having an emitter and a base layer forming a photoelectric junction; and
    forming a near infrared (NIR) wideband reflector layer disposed below the upper subcell and above the lower subcell for reflecting light in the spectral range of 900 to 1050 nm which represents unused and undesired solar energy and thereby reducing the overall solar energy absorptance in the solar cell and providing thermodynamic radiative cooling of the solar cell when deployed in space outside the atmosphere;
    wherein the wideband reflector layer includes a first distributed Bragg reflector (DBR) structure disposed between a buffer layer and a tunnel diode layer, wherein the buffer layer is a nucleation layer, and wherein the first DBR structure, the tunnel diode layer, and the buffer layer are disposed between the same pair of the upper and lower solar subcells of the multijunction solar cell, the pair of solar upper and lower subcells having zero, one or two solar subcells disposed between them, wherein the DBR structure is composed of a plurality of alternating layers of different semiconductor materials with discontinuities in their respective indices of refraction and arranged so that light can enter and pass through the upper solar subcell and at least a first portion of said light in a first spectral wavelength range can be reflected back into the upper solar subcell and out of the solar cell by the first DBR structure, and a second portion of said light in a second spectral wavelength can be transmitted through the first DBR structure to the layers disposed beneath the first DBR structure, wherein the second spectral wavelength range is greater than 1050 nm.

2. A method in claim 1, further comprising:
    forming a second distributed Bragg reflector (DBR) structure disposed directly beneath the first DBR structure and composed of a plurality of alternating layers of different semiconductor materials with discontinuities in their respective indices of refraction and arranged so that light can enter and pass through the first DBR structure and at least a portion of which light can enter and pass through the first DBR structure and at least a portion of which light in a spectral wavelength range of 750 to 900 nm can be reflected back into the upper solar subcell by the second DBR structure, and a second portion of which light in a third spectral wavelength range can be transmitted through the second DBR structure to the lower solar subcell disposed beneath the second DBR structure.

3. A method as defined in claim 1, wherein the lower solar subcell comprise a germanium substrate including a first photoactive junction and forming a bottom solar subcell, and the upper solar subcell comprises InGaP, InGaP/InGaAs, or InGaAs.

4. A method as defined in claim 1, wherein the first DBR structure includes alternating layers of lattice mismatched materials and includes a first DBR sublayer composed of a plurality of n type or p type $Al_xGa_{1-x}As$ layers, and a second DBR sublayer disposed over the first DBR sublayer and composed of a plurality of n or p type $Al_yGa_{1-y}As$, where $0<x<1$, $0<y<1$, and y is greater than x.

5. A method as defined in claim 4, wherein the sequence of first and second different semiconductor sublayers comprises compressively strained and tensionally strained layers, respectively.

6. A method as defined in claim 4, wherein each of the first and second DBR sublayers is approximately 300 to 800 angstroms thick.

7. A method as defined in claim 1, wherein the multijunction solar cell is a triple junction solar cell that comprises said upper solar subcell, said lower solar subcell, and a middle solar subcell disposed between the upper and lower solar subcells and wherein the first DBR structure is disposed between the middle solar subcell and the lower solar subcell.

8. A method as defined in claim 1, wherein the multijunction solar cell is a four junction solar cell that comprises said upper solar subcell, said lower solar subcell, and first and second middle solar subcells disposed between the upper and lower solar subcells wherein the lower solar subcell has a band gap of approximately 0.67 eV, a second one of the middle solar subcells adjacent to the lower solar subcell has a band gap of approximately 1.41 eV, a first one of the middle solar subcells adjacent the upper solar subcell has a band gap in the range of approximately 1.65 to 1.8 eV and the upper solar subcell has a band gap in the range of 2.0 to 2.15 eV.

9. A method as defined in claim 8, wherein the first one of the middle solar subcells has a band gap of approximately 1.73 eV, and the upper solar subcell has a band gap of approximately 2.10 eV.

10. A method as defined in claim 8, wherein the first DBR structure is disposed between the second one of the middle solar subcells and the lower solar subcell.

11. A method as defined in claim 8, wherein:
the upper first subcell is composed of InGaAlP, with the amount of aluminum (Al) being at least 20% by mole fraction;
the first middle solar subcell includes an emitter layer composed of indium gallium phosphide, (In)AlGaAs (P) or InGaAsP, and a base layer composed of (In)AlGaAs(P) or InGaAsP, wherein each of the terms in parentheses represents an optional or a small amount of the element noted in the parentheses:
the middle solar subcell is composed of indium gallium arsenide; and
the lower solar subcell is composed of germanium.

12. A method as defined in claim 2, wherein the second DBR structure includes alternating layers of lattice mismatched materials and includes a first DBR sublayer composed of a plurality of n type and p type $Al_xGa_{1-x}As$ layers, and a second DBR sublayer disposed over the first DBR sublayer and composed of a plurality of n or p type $Al_yGa_{1-y}As$ layers, where $0<x<1$, $0<y<1$, and y is greater than x, wherein the sequence of first and second different semiconductor sublayers comprises compressively strained and tensionally strained layers, respectively.

13. A method as defined in claim 1, wherein the radiative cooling of the solar cell is in excess of 4 degrees Centigrade.

14. A method of forming a multijunction solar cell comprising:
forming an upper and a lower solar subcell each having an emitter and a base layer forming a photoelectric junction; and
forming a near infrared (NIR) wideband reflector layer disposed below the upper subcell and above the lower subcell for reflecting light in the spectral range of 900 to 1050 nm which represents unused and undesired solar energy and thereby reducing the overall solar energy absorptance in the solar cell and providing thermodynamic radiative cooling of the solar cell when deployed in space outside the atmosphere;
wherein the wideband reflector layer includes a first distributed Bragg reflector (DBR) structure disposed above a tunnel diode layer, wherein the first DBR structure and the tunnel diode layer are disposed between the same pair of upper and lower solar subcells of the multijunction solar cell, the pair of upper and lower solar subcells having zero, one or two solar subcells disposed between them, wherein the first DBR structure is composed of a plurality of alternating layers of different semiconductor materials with discontinuities in their respective indices of refraction and arranged so that light can enter and pass through the upper solar subcell and at least a first portion of said light in a first spectral wavelength range can be reflected back into the upper solar subcell and out of the solar cell by the first DBR structure, and a second portion of said light in a second spectral wavelength can be transmitted through the first DBR structure to the layers disposed beneath the first DBR structure, wherein the second spectral wavelength range is greater than 1050 nm; and
wherein the first DBR structure includes alternating layers of lattice mismatched materials and includes a first DBR sublayer composed of a plurality of n type or p type $Al_xGa_{1-x}As$ layers, and a second DBR sublayer disposed over the first DBR sublayer and composed of a plurality of n or p type $Al_yGa_{1-y}As$, where $0<x<1$, $0<y<1$, and y is greater than x, and the sequence of first and second different semiconductor sublayers comprises compressively strained and tensionally strained layers, respectively.

15. A method in claim 14, further comprising:
forming a second distributed Bragg reflector (DBR) structure disposed directly above or directly beneath the first DBR structure and composed of a plurality of alternating layers of different semiconductor materials with discontinuities in their respective indices of refraction and arranged so that light can enter and pass through the first DBR structure and at least a portion of which light in a spectral wavelength range of 750 to 900 nm can be reflected back into the upper solar subcell by the second DBR structure, and a second portion of which light in a third spectral wavelength range can be transmitted through the second DBR structure to the lower solar subcell disposed beneath the second DBR structure.

16. A method as defined in claim 14, wherein the lower solar subcell comprise a germanium substrate including a first photoactive junction and forming a bottom solar subcell, and the upper solar subcell comprises InGaP, InGaP/InGaAs, or InGaAs.

17. A method as defined in claim 14, wherein the multijunction solar cell is a triple junction solar cell that comprises said upper solar subcell, said lower solar subcell, and a middle solar subcell disposed between the upper and lower solar subcells.

18. A method as defined in claim 17, wherein the first DBR structure is disposed between the middle solar subcell and the lower solar subcell.

19. A method of forming a multijunction solar cell comprising:
forming an upper and a lower solar subcell each having an emitter and a base layer forming a photoelectric junction; and
forming a near infrared (NIR) wideband reflector layer disposed below the upper subcell and directly above the lower subcell for reflecting light in the spectral range of 900 to 1050 nm which represents unused and undesired solar energy and thereby reducing the overall solar energy absorptance in the solar cell and providing thermodynamic radiative cooling of the solar cell when deployed in space outside the atmosphere;
wherein the wideband reflector layer includes a first distributed Bragg reflector (DBR) structure disposed between a buffer layer and a tunnel diode layer, wherein the buffer layer is a nucleation layer disposed directly above the lower solar subcell, and wherein the first DBR structure, the tunnel diode layer, and the buffer layer are disposed between the upper and lower solar subcells of the multijunction solar cell, the upper and lower pair of solar subcells having no other solar subcell disposed between them, wherein the first DBR structure is composed of a plurality of alternating layers of different semiconductor materials with discontinuities in their respective indices of refraction and arranged so that light can enter and pass through the upper solar subcell and at least a first portion of said light in a first spectral wavelength range can be reflected back into the upper solar subcell and out of the solar cell by the first DBR structure, and a second portion of said light in a second spectral wavelength can be transmitted through the first DBR structure to the layers disposed beneath the first DBR structure, wherein the second spectral wavelength range is greater than 1050 nm.

* * * * *